(12) United States Patent
Montmeat et al.

(10) Patent No.: US 11,335,584 B2
(45) Date of Patent: May 17, 2022

(54) METHOD OF DISMANTLING A STACK OF AT LEAST THREE SUBSTRATES

(71) Applicant: COMMISSARIAT A L'ENERGIE ATOMIQUE ET AUX ENERGIES ALTERNATIVES, Paris (FR)

(72) Inventors: Pierre Montmeat, Grenoble (FR); Thierry Enot, Grenoble (FR); Frank Fournel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/097,397

(22) Filed: Nov. 13, 2020

(65) Prior Publication Data

US 2021/0175112 A1  Jun. 10, 2021

(30) Foreign Application Priority Data

Nov. 14, 2019 (FR) ...................................... 19 12687

(51) Int. Cl.
*B32B 43/00* (2006.01)
*H01L 21/683* (2006.01)
(Continued)

(52) U.S. Cl.
CPC .... *H01L 21/6836* (2013.01); *H01L 21/76251* (2013.01); *H01L 24/83* (2013.01);
(Continued)

(58) Field of Classification Search
CPC . B32B 38/10; B32B 43/006; Y10T 156/1158; Y10T 156/1168;
(Continued)

(56) References Cited

U.S. PATENT DOCUMENTS

| 6,117,778 A * | 9/2000 | Jones ................... H01L 21/6708 |
| | | 257/E21.244 |
| 2009/0218560 A1* | 9/2009 | Flaim .................. H01L 21/6835 |
| | | 257/9 |

(Continued)

FOREIGN PATENT DOCUMENTS

FR          3 015 110 A1       6/2015

OTHER PUBLICATIONS

French Preliminary Search Report dated Sep. 29, 2020 in French Application 19 12687 filed on Nov. 14, 2019 (with English Translation of Categories of Cited Documents & Written Opinion), 9 pages.

(Continued)

*Primary Examiner* — Philip C Tucker
*Assistant Examiner* — Nickolas R Harm
(74) *Attorney, Agent, or Firm* — Oblon, McClelland, Maier & Neustadt, L.L.P.

(57) ABSTRACT

A method for disassembling a stack of at least three substrates. The invention relates to the techniques for transferring thin films in the microelectronics field. It proposes a method for disassembling a stack of at least three substrates having between them two interfaces, one interface of which has an adhesion energy and an interface of which has an adhesion energy, with less than, the method comprising: 1) implementing a removal of material on the first substrate, in order to expose a surface of the second substrate, 2) transferring the stack onto a flexible adhesive film so that the surface has, with an adhesive layer of the film, an adhesion energy greater than, and 3) disassembling the third substrate at the interface between the second substrate and the third substrate. The method makes it possible to open the stack via the interface thereof with the highest adhesion energy.

24 Claims, 4 Drawing Sheets

(51) Int. Cl.
H01L 21/762 (2006.01)
H01L 23/00 (2006.01)
H01L 21/304 (2006.01)
B32B 38/10 (2006.01)

(52) U.S. Cl.
CPC .............. *H01L 24/98* (2013.01); *B32B 38/10* (2013.01); *B32B 43/006* (2013.01); *H01L 21/304* (2013.01); *H01L 2221/68381* (2013.01); *H01L 2224/8349* (2013.01); *H01L 2224/83095* (2013.01); *H01L 2224/83193* (2013.01); *H01L 2924/20106* (2013.01); *Y10T 156/1158* (2015.01); *Y10T 156/1168* (2015.01); *Y10T 156/1184* (2015.01); *Y10T 156/1917* (2015.01); *Y10T 156/1967* (2015.01)

(58) Field of Classification Search
CPC ......... Y10T 156/1184; Y10T 156/1917; Y10T 156/1967
See application file for complete search history.

(56) References Cited

U.S. PATENT DOCUMENTS

| | | | |
|---|---|---|---|
| 2011/0308739 A1* | 12/2011 | McCutcheon | H01L 21/67092 156/766 |
| 2013/0248099 A1* | 9/2013 | Shimizu | H01L 21/6835 156/247 |
| 2014/0130969 A1* | 5/2014 | McCutcheon | B32B 38/10 156/247 |
| 2014/0234664 A1* | 8/2014 | Yasumoto | H01L 51/003 428/698 |
| 2014/0251546 A1* | 9/2014 | Deguchi | B32B 38/1858 156/702 |
| 2015/0125665 A1* | 5/2015 | Nakase | B32B 27/36 428/172 |
| 2015/0221544 A1* | 8/2015 | Landru | H01L 21/67092 438/458 |
| 2016/0167358 A1* | 6/2016 | Tang | B05D 1/02 156/247 |
| 2016/0358805 A1 | 12/2016 | Broekaart et al. | |
| 2017/0025301 A1 | 1/2017 | Montmeat et al. | |
| 2017/0217129 A1* | 8/2017 | Yamada | B32B 27/325 |

OTHER PUBLICATIONS

Maszara et al., "Bonding of silicon wafers for silicon-on-insulator", J. Appl. Phys., vol. 64, No. 10, Nov. 15, 1988, pp. 4943-4950.

* cited by examiner

METHOD OF DISMANTLING A STACK OF AT LEAST THREE SUBSTRATES

TECHNICAL FIELD

The present invention relates to techniques for transferring thin films in the microelectronics field. It finds a particularly advantageous application in the field of techniques for manufacturing microelectronic components.

PRIOR ART

Film transfers are often implemented by means of bonding techniques, the latter making it possible to obtain a stack of films. One of the parameters that governs the success of the transfers is the adhesion energy of the various films in the stack.

As illustrated in FIG. 1, a stack 123 composed of three films or substrates, referenced S1, S2 and S3, includes two interfaces, referenced 12 and 23, characterised respectively by two adhesion energies, denoted E12 and E23. If the adhesion energy E12 is less than the adhesion energy E23, disassembling the stack 123 naturally leads to opening the interface with the lowest adhesion energy, i.e. the interface between the substrates S1 and S2, rather than opening the interface with the highest adhesion energy, i.e. the interface between the substrates S2 and S3. Thus, if no precaution is taken for it to be otherwise, disassembling the stack 123 results in separating the assembly S2/S3 of the substrate S1 and thus releasing the substrate S1 from the stack 123, supposing that the cohesion energy within each film is higher at least than the adhesion energy E12, or even the adhesion energy E23. On the other hand, releasing the substrate S3 from the assembly S1/S2 is not a minor thing. This finding is also clear from the fact that heat treatment of the stack 123, if it were to actually modify the adhesion energies E12 and E23, would at the very least preserve the relationship of order between these adhesion energies.

It may however be useful, or even necessary, to be able to release the substrate S3 from the assembly S1/S2. Such a need may be encountered in the field of the manipulation of thin wafers by means of temporary bonding with glass handles. One illustrative example is described below with reference to FIG. 2.

FIG. 2 illustrates a case where, to facilitate the treatment and recognition of the films on certain items of equipment, it must be possible to opacify the glass of the handle by bonding thereto an opaque silicon wafer, then to remove the opacification. More particularly, a glass handle S2 may be opacified by an opaque silicon wafer S3 and be attached to a substrate S1 in order to allow manipulation thereof. This manipulation may, as with the example illustrated in FIG. 2, be intended to allow thinning and trimming of the substrate S1 in order to obtain a thin film, also referenced S1. Removing the opacification, for example in order to be able to reveal markings on the thin film S1, then involves the release of the opaque silicon wafer S3 from the assembly S1/S2.

According to another example, a film of titanium and/or titanium nitride may be used as an opacifier by being deposited on a glass handle, before having to be separated therefrom in order to be able to successfully implement the subsequent technological steps.

Currently, the opacification is for example removed by grinding the opacifier, which necessarily results in destruction thereof. It will thus be understood that it may be preferable, in particular when the opacifier is a silicon wafer, to be able to preserve it, or even to reuse it.

One object of the present invention is to propose a method for disassembling a stack comprising at least three substrates bonded in pairs by two interfaces, one of which has an adhesion energy higher than the other, the disassembling having to be obtained by the interface with the higher adhesion energy, preferably so as to preserve the integrity of the parts of the stack disassembled from each other, so as to be able where applicable to (re)use each of these parts.

The other aspects, objects, features and advantages of the present invention will emerge from the examination of the following description and accompanying drawings. Naturally other advantages may be incorporated.

SUMMARY

To achieve this objective, according to a first aspect of the invention, a method is provided for disassembling a stack of at least three substrates having between them two interfaces, among which a first interface between the first substrate and the second substrate of the stack has a first adhesion energy and a second interface between the second substrate and the third substrate in the stack has a second adhesion energy, the first adhesion energy being lower, or even strictly lower, than the second adhesion energy, the stack comprising a front face and a rear face between which the first substrate, the second substrate and then the third substrate extend successively, the disassembly method comprising the following successive steps:

- implementing, through the front face of the stack, a removal of material on the first substrate, until a surface of the second substrate is exposed,
- transferring, preferably by lamination, the stack, by means of the front face thereof, onto an adhesive layer of a flexible adhesive film until the surface is in contact with the adhesive layer and has therewith an adhesion energy that is higher, preferably strictly higher, than the second adhesion energy, and
- disassembling the third substrate from the flexible adhesive film and from the assembly comprising the first and second substrates, at the interface between the second substrate and the third substrate in the stack.

The disassembly method as introduced above therefore makes it possible to open the interface having, in the stack, a higher adhesion energy compared with at least one other interface in the stack. The method thus meets a requirement in the field of the manipulation of thin wafers by means of a temporary bonding, for example on a glass handle.

Another aspect relates to a microelectronic device to be disassembled, comprising:

- a stack of at least three substrates having between them two interfaces, among which a first interface between the first substrate and the second substrate of the stack has a first adhesion energy and a second interface between the second substrate and the third substrate in the stack has a second adhesion energy, the first adhesion energy being lower, or even strictly lower, than the second adhesion energy, the stack comprising a front face and a rear face between which the first substrate, the second substrate and then the third substrate extend successively, the second substrate having an exposed surface, and
- a flexible adhesive film comprising an adhesive layer onto which the stack is transferred by means of the front face thereof, the surface being in contact with the adhesive layer and having therewith an adhesion energy higher, preferably strictly higher, than the second adhesion energy.

BRIEF DESCRIPTION OF THE FIGURES

The aims, objects, features and advantages of the invention will appear more clearly from the detailed description of an embodiment thereof that is illustrated by the following accompanying drawings, wherein.

Figure 1:
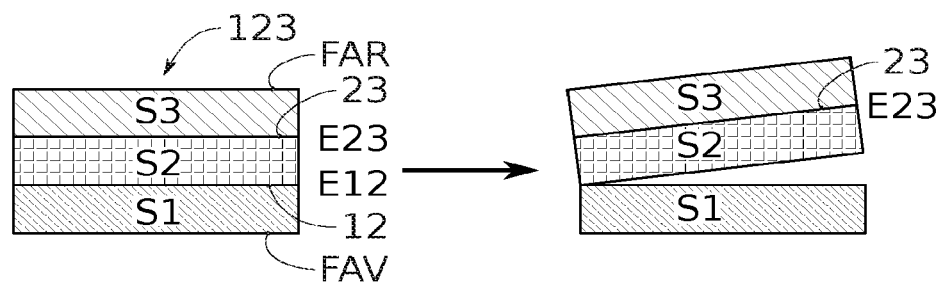
FIG. 1 shows schematically the disassembling of a stack of three substrates according to the prior art.
Figure 2:
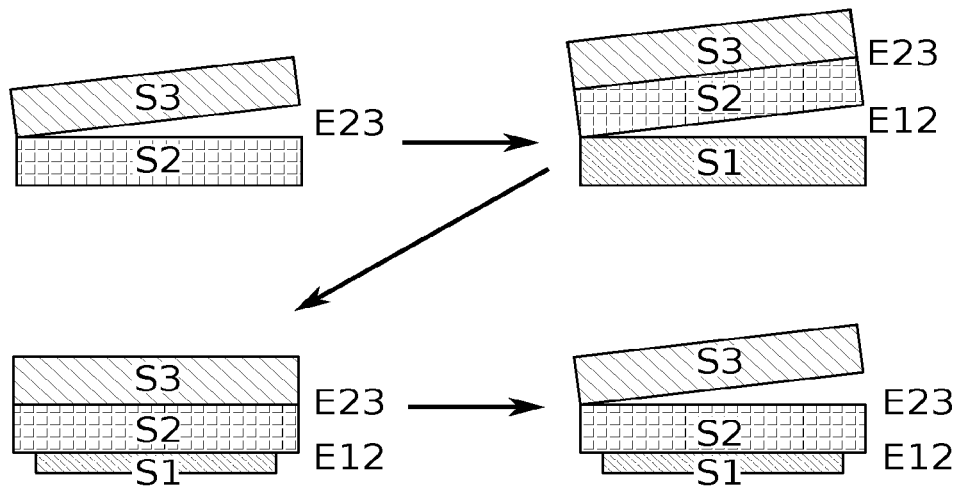
FIG. 2 shows schematically a disassembling of a stack of three substrates that the invention aims to allow.

The drawings are given by way of examples and are not limitative of the invention. They constitute schematic outline representations intended to facilitate understanding of the invention and are not necessarily to the scale of practical applications. In particular, the thicknesses and the extents of the various substrates, films and other layers illustrated do not necessarily represent reality.

DETAILED DESCRIPTION

Before beginning a detailed review of embodiments of the invention, optional features, which may optionally be used in association or alternatively, are stated below:

Before the step of removing material, the substrates in the stack may have substantially the same extent and are preferably superimposed on each other in a centred fashion.

Before the step of removing material, the stack may be in the form of a substantially circular wafer, for example approximately 300 mm in diameter.

The removal of material applied to the first substrate may comprise, or even consist of, an at least partial, preferably total, trimming of the first substrate and where applicable a thinning of the first substrate. The disassembling of the third substrate is thus facilitated because the exposed surface comprises at least part of the periphery at the second interface; in particular, a wedge may be inserted therein. More particularly, the first substrate may be trimmed by cropping a peripheral region of the first substrate over the entire thickness e1 thereof, where applicable by cropping a region at the periphery of the second substrate over a depth p strictly less than the thickness e2 of the second substrate. Moreover, trimming the first substrate may be parameterised so that the surface extends over a first width d, taken from an edge of the region at the periphery, greater than 0.25 mm.

According to a first embodiment of the method introduced above, the thickness of the adhesive layer is chosen so as to be greater, preferably strictly greater, than the thickness e1 of the first substrate, where applicable with the depth p over which the second substrate has been cropped added. For example, the thickness of the adhesive layer is substantially equal to 130 μm. A flexible adhesive film according to this characteristic advantageously makes it possible to encapsulate the topography of the front face of the stack, at least on the part thereof extending from the exposed surface of the second substrate towards the front face of the stack, this topography being at least due to the removal of material applied to the first substrate via the front face of the stack. The transfer of the stack onto the flexible adhesive film can then be implemented so that the surface is fully in contact with the adhesive layer. A maximum contact surface between the second substrate and the adhesive layer of the flexible adhesive film is thus achieved, which advantageously makes it possible to limit to the maximum the width d of the region at the periphery over which the second substrate must be exposed.

According to a second embodiment of the method introduced above, the thickness of the adhesive layer is selected so as to be strictly less than the thickness e1 of the first substrate, where applicable with the depth p over which the second substrate has been cropped added. For example, the thickness of the adhesive layer is substantially equal to 10 μm. The method thus provides an alternative for the case where the thickness of the adhesive layer is not sufficient to encapsulate the topography of the front face of the stack, making the method operational with a wide range of flexible adhesive films, or even with any flexible adhesive film. The first width d over which the surface extends is then preferably greater than 1.5 mm. The method thus makes it possible to guarantee sufficient contact between the exposed surface of the second substrate and the adhesive layer of the flexible adhesive film for the adhesion energy between said exposed surface and said adhesive layer to be greater, or even strictly greater, than the second adhesion energy. Moreover, the flexible adhesive film having an extent greater, preferably by a factor greater than 1.25, than the extent of the stack, transferring the stack onto the adhesive layer of the flexible adhesive film may comprise a deformation of the flexible adhesive film. The method thus makes it possible to guarantee a sufficient ability of the flexible adhesive film to deform in order to be able to suitably contact the exposed surface of the second substrate, and thus prevent any risk of rupturing the flexible adhesive film when the stack is transferred. More particularly, the deformation of the flexible adhesive film may be implemented so that the adhesive layer is in contact with at least part of the exposed surface of the second substrate, this part extending over a second width I, taken from one edge of the second substrate, greater than 0.25 mm. Because of the insufficiency of the thickness of the adhesive layer for encapsulating the topology of the front face of the stack, a deformation of the flexible adhesive film is sought which, if it allows sufficient contacting between the exposed surface of the substrate and the adhesive layer of the flexible adhesive film, does not necessarily lead to a contacting of the whole of the exposed surface of the second substrate with the adhesive layer of the flexible adhesive film. In other words, a part of the exposed surface of the second substrate is then generally not in contact with the adhesive layer; the method is however still implementable.

The features stated below relate indifferently to the first embodiment and to the second embodiment introduced above.

The first adhesion energy may be less than the second adhesion energy by a value of between 0.1 and 1 $J/m^2$, preferably between 0.2 $J/m^2$ and 0.5 $J/m^2$. For example, the first adhesion energy is substantially equal to 0.4 $J/m^2$ and the second adhesion energy is substantially equal to 0.7 $J/m^2$. Furthermore, the adhesive layer of the flexible adhesive film may initially, i.e. before any reduction in the adhesion energy thereof, where applicable by applying to the adhesive layer a heat treatment and/or insolation by UV, have an adhesion energy greater than the second adhesion energy. More particularly, the adhesion energy of the adhesive layer may be greater than 0.7 J/m$^2$, preferably greater than 1.0 J/m$^2$. The adhesion energy between the surface and the adhesive layer may more particularly be greater than the second adhesion energy by at least a value substantially equal to 0.5 J/m$^2$. The method thus makes it possible to ensure the ability to open the stack via the second interface using standard methods to do this.

Two substrates among said at least three substrates each comprising a film for anchoring to the other of the two substrates, the adhesion energy between the two substrates is defined by the adhesion energy between the anchoring films. The method thus makes it possible to finely control the adhesion energy between two substrates in the stack.

The first width d over which the exposed surface of the second substrate extends is at least 10 times, preferably at least 100 times, less than the extent of the second substrate. In addition or alternatively, the first width d over which the exposed surface of the second substrate extends is preferably less than 10 mm. The method according to each of these last two features thus makes it possible to limit the loss of material caused by the trimming step.

The depth p over which the peripheral region of the second substrate is where applicable removed is:
  greater than 10 μm, for example substantially equal to 20 μm, and/or
  strictly less than half, preferably less than one tenth, of the thickness of the second substrate.
The method thus makes it possible to ensure:
  firstly, by limiting the number of precautions to be taken, that the adhesive layer of the flexible adhesive film contacts the exposed surface of the second substrate, and not the exposed surface of the first substrate,
  secondly to limit the loss of material caused by the trimming step.

The third substrate can be disassembled by inserting a wedge in the stack at the second interface. The method thus makes it possible to ensure that the third substrate is disassembled by a standard method, not requiring any special precautions compared with the ordinary.

The disassembly method according to the first aspect of the invention may further comprise, before the stack is transferred onto the adhesive layer of the flexible adhesive film, at least one technological step applied at least to the first substrate, said technological step comprising for example at least one step chosen from: step of trimming the first substrate, a step of thinning the first substrate and a step of marking the first substrate. The method thus advantageously provides for the use of the third substrate as a handle enabling the stack to be manipulated in order to conduct at least one of the aforementioned technological steps.

The disassembly method according to the first aspect of the invention may further comprise the following step: following the disassembling of the third substrate, releasing the assembly comprising the first second substrates from the flexible adhesive film, where appropriate by applying to the adhesive layer a heat treatment or an insolation by UV so as to reduce the adhesion energy thereof. The method thus allows the subsequent use of the assembly comprising the first and second substrates, in particular for implementing, on this assembly, at least one technological step that would be made complex, or even prevented, by the presence of the third substrate and/or of the flexible adhesive film.

Moreover, the second substrate may comprise, or even consist of, a glass handle and the third substrate may be based on an opaque material. Preferably, the opacity of the third substrate is an opacity to visible light mainly. The disassembly method according to this feature allows the removal of the opacification, this removal being able to be necessary for revealing markings on the first substrate optionally trimmed and/or thinned.

According to one specificity, the first substrate may comprise a wafer based on silicon, said wafer having for example a thickness e1 substantially equal to 775 μm and having where applicable been trimmed by cropping a peripheral region of the wafer over a width, taken from one edge of the wafer, substantially equal to 1.5 mm and over a depth substantially equal to 200 μm.

The disassembly method according to this specificity may then further comprise the deposition of a first anchoring film, on a free surface, where appropriate trimmed, of the silicon-based wafer of the first substrate, in order to obtain the first substrate. The first anchoring film is preferably based on an organic material and may have a thickness substantially equal to 20 μm.

In addition, the third substrate may comprise, or even consist of, a silicon-based wafer. The latter has for example a thickness e3 substantially equal to 775 μm.

In addition also, the second substrate may comprise a glass wafer. The latter has for example a thickness e21 substantially equal to 700 μm.

The disassembly method according to these last two additions may further comprise the transfer of the third substrate onto the glass wafer of the second substrate, preferably by adhesive bonding. For example, this adhesive bonding is obtained by annealing at a temperature substantially equal to 250° C. for a period substantially equal to two hours.

The disassembly method according to the previous feature may further comprise the deposition of a second anchoring film on the free surface of the glass wafer, to obtain an assembly comprising the second and third substrates. Preferably, the second anchoring film is based on a fluorinated polymer and has a thickness substantially equal to 5 nm. Where applicable, the assembly comprising the second and third substrates is obtained by annealing at a temperature substantially equal to 150° C. for a period substantially equal to 30 minutes.

In addition, the disassembly method according to the first aspect of the invention may further comprise the transfer of the first substrate onto the assembly comprising the second and third substrates, via the first and second anchoring films. The disassembly method may then further comprise a step consisting of thinning the silicon-based wafer of the first substrate. Preferably, the thinning of the silicon-based wafer of the first substrate is implemented until the thickness e1 thereof is reduced to a value substantially lying between 50 μm and 100 μm.

It is stated that, in the context of the present invention, "less than" and "greater than" mean "less than or equal to" and "greater than or equal to", respectively. Equality is excluded by use of the terms "strictly less than" and "strictly greater than". Equally, the expressions of the type "equal, less than, greater than" mean comparisons that may accommodate certain tolerances, in particular according to the scale of magnitude of the values compared and the measurement uncertainties. Values that are substantially equal, less than or greater than fall within the scope of interpretation of the invention.

A parameter "substantially equal to/greater than/less than" a given value means that this parameter is equal to/greater than/less than the given value, to within plus or minus 20%, or even 10%, of this value. A parameter "substantially lying between" two given values means that this parameter is at a minimum equal to the smallest given value, to within plus or minus 20%, or even 10%, of this value, and at a maximum equal to the largest given value, to within plus or minus 20%, or even 10%, of this value.

A film based on a material A means a film comprising this material A and optionally other materials.

In the following description, the thickness of a substrate, of a film or of a layer are generally measured in directions perpendicular to the extent of the substrate, of the film or of the layer. Thus the accompanying figures showing views in section transverse to the extent of the substrate, of the films or of the layers that are shown, the thicknesses are generally taken in a vertical direction on these figures.

A first embodiment of the disassembly method according to the first aspect of the invention is described below with reference to FIGS. 3A, 3B and 4.

Figure 3:
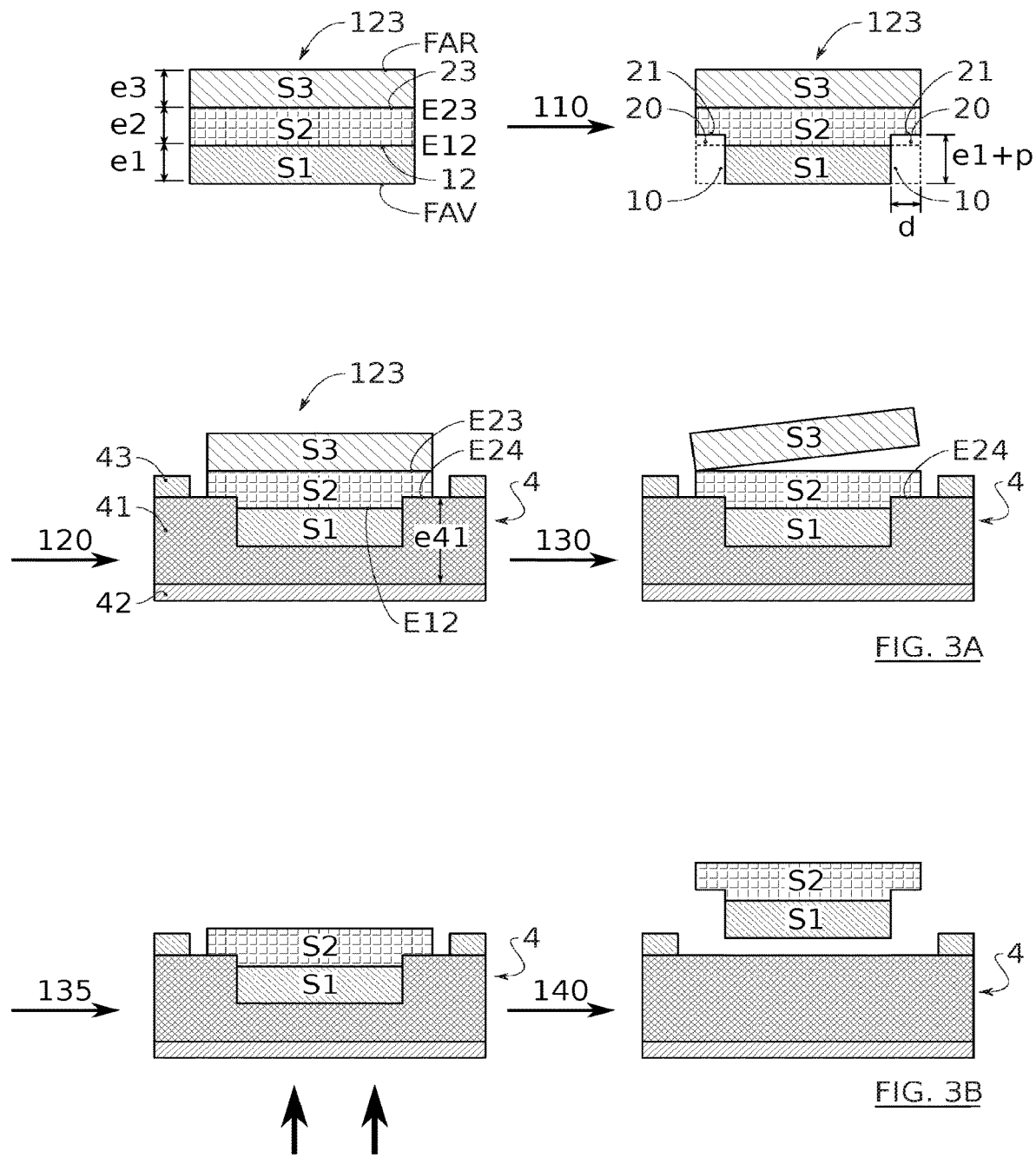
FIGS. 3A and 3B show schematically various steps of a first embodiment of the method according to the first aspect of the invention.

The stack 123 presented in FIG. 3A is composed of three substrates S1, S2, S3 and is characterised by adhesion energies E12 and E23 such that E12<E23. The thickness of the first substrate S1 is e1.

A trimming 110 of the substrate S1 is implemented over a width d, greater than 0.5 mm, preferably greater than 0.25 mm, and a depth e1+p, with p≥0 μm. Thus the second substrate S2 may itself be trimmed 110 by a depth p. In this way a surface 21 of the second substrate S2 is exposed. Note that the width d is preferably less than 10 mm.

This stack 123 is laminated 120 on a flexible adhesive film 4 held by a rigid frame 43, so as to produce a contact between the adhesive layer 41 of the film 4 and the exposed surface 21 of the substrate S2.

In the first embodiment, the thickness e41 of the adhesive layer 41 of the film 4 is greater than e1+p, preferably by at least 20 μm.

Then the stack 123 is disassembled 130 by opening the interface E23 between the second substrate S2 and the third substrate S3.

This disassembling 130 is made possible because the interface E12 between the first substrate S1 and the second substrate S2 cannot be opened since the substrate S2 is held by the adhesive of the adhesive layer 41 of the film 4. The substrate S3 is thus released.

With reference to FIG. 3B, the film 4 can next be insolated under UV in order to release the assembly S2/S1.

A complete example of implementation of the first embodiment of the disassembly method described above is presented in FIG. 4. Wafers 300 mm in diameter are used.

A hydrophilic cleaning (RCA) is implemented on a first silicon wafer S3 775 μm thick and on a glass wafer S21 700 μm thick. The wafers S3 and S21 are bonded and then annealed at 250° C. for two hours. The adhesion energy E23 of the bonding is evaluated by the Maszara method at 0.7 J/m². On the glass wafer S21, a film S22 is spread, for example a fluorinated film of Novec™ 2702, and the assembly is annealed at 150° C. for 30 minutes. An assembly S2/S3 is obtained.

By means of a diamondised saw, a second silicon wafer S11 is trimmed over a width of 1.5 mm and a depth of 200 μm. A layer of adhesive S12 is spread, for example a 20 μm layer of BrewerBOND® adhesive 305, on this wafer S11, in order to obtain the first substrate S1 of the stack 123 to be formed.

The adhesive layer S12 and the film S22 are used as films for anchoring to each other. The first substrate S1 is therefore bonded at 200° C. with the stack S3/S2 so as to create an interface 12 between the layer of adhesive S12 and the film S22. The bonding is implemented at 200° C. The adhesion energy E12 of this new interface 12 is evaluated by the Maszara method at 0.4 J/m².

The second silicon wafer S11 is thinned to 50 μm by mechanical abrasion by means of a diamondised wheel. The thinned stack 123 is fixed 120 to a rigid frame 43 by means of an adhesive flexible film 4, for example known by the Furukawa trade name SP-537T-230, which has an adhesive layer 41 of 130 μm associated with a support film 42 of 100 μm. The first silicon wafer S3 is disassembled 130 by inserting a wedge in the stack 123 at the interface 23. A UV insolation 135 of the adhesive flexible film 4 makes it possible to release 140 the assembly formed by the first substrate S1 and the second substrate S2, the second silicon wafer S11 being thinned.

A second embodiment of the disassembly method according to the first aspect of the invention is described below with reference to FIGS. 5 and 6.

This second embodiment is to be envisaged in the case where the thickness e41 of the adhesive layer 41 of the adhesive flexible film 4 is not sufficient to encapsulate the first substrate S1 and to contact the exposed surface 21 of the second substrate S2 that has been trimmed 110.

Figure 5:
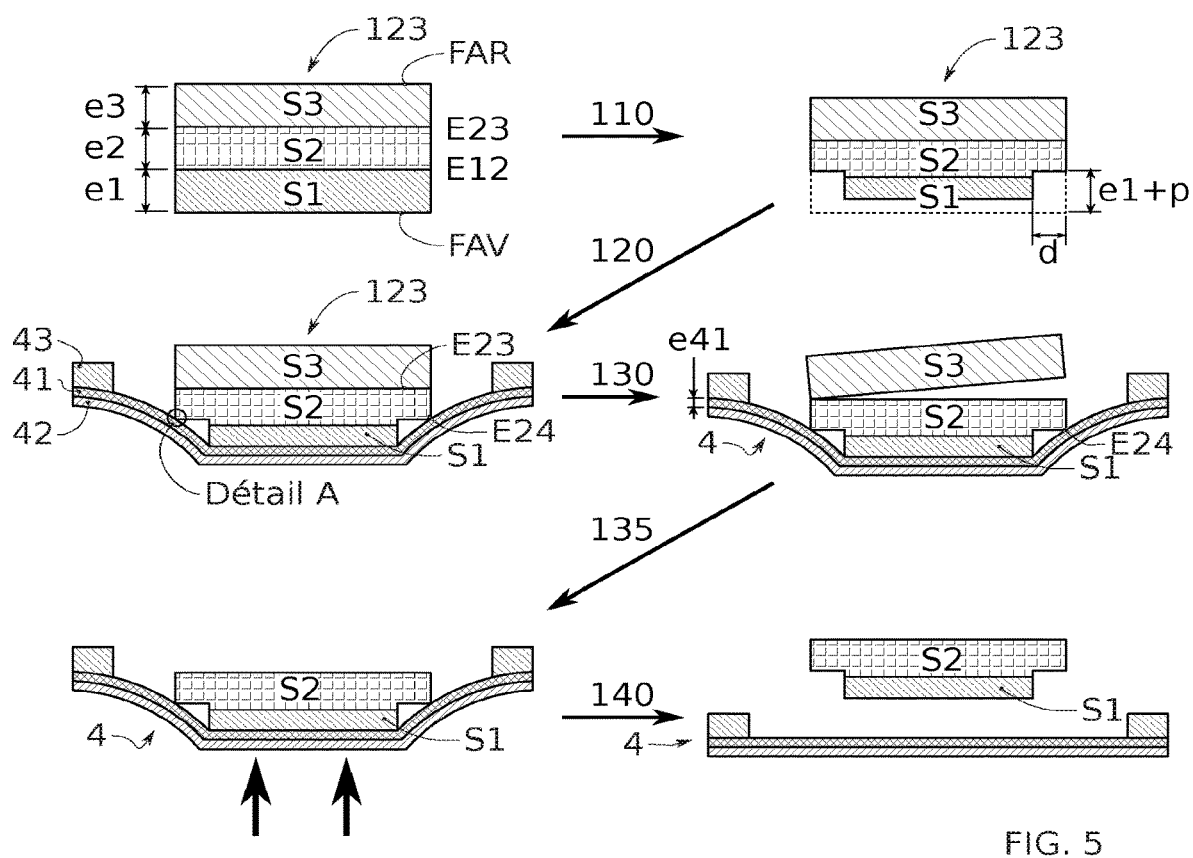
FIG. 5 shows schematically various steps of a second embodiment of the method according to the first aspect of the invention.

A stack 123, as illustrated in FIG. 5, and potentially identical to the one presented in FIG. 3A, undergoes a trimming 110 of the first substrate S1 over a width d, preferably greater than 1.5 mm, and over a depth e1+p, with p≥0 μm. Thus the substrate S2 can itself be trimmed 110 by a depth p.

This stack 123 is next laminated 120 on the adhesive layer 41 of a flexible adhesive film 4. The film 4 is sufficiently flexible and the trimming 110 of a width d sufficiently great to provide contact between the adhesive layer 41 and the exposed surface 21 of the second substrate S2.

Figure 6:
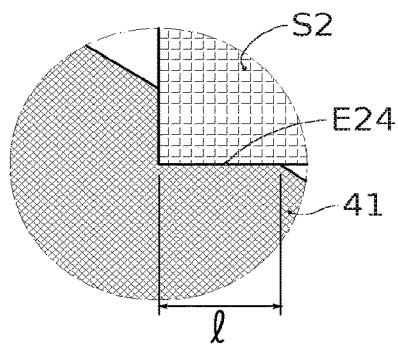
FIG. 6 shows an enlargement of the part identified by a circle referenced "detail A" in FIG. 5.

More particularly, as illustrated by FIG. 6, the contact between the adhesive layer 41 and the exposed surface 21 of the second substrate S2 extends over a ring with a width l greater than 0.25 mm.

The structure is disassembled 130 by opening the interface 23; the interface 12 cannot be opened since the second substrate S2 is held by the adhesive layer 41 of the film 4. The third substrate S3 is thus released.

The film 4 can then be insolated under UV in order to release the assembly S2/S1.

A complete example of implementation of the second embodiment of the disassembly method described above is described below. There also wafers 300 mm in diameter are used.

A hydrophilic cleaning (RCA) is implemented on a first silicon wafer 775 μm thick and on a glass wafer 700 μm thick. The wafers are bonded together and then annealed at 250° C. for two hours. The adhesion energy of the bonding is evaluated at 0.7 J/m². On the glass wafer of the bonding, a fluorinated film of Novec™ 2702 is spread and the assembly is annealed at 150° C. for 30 minutes.

20 μm of BrewerBOND® adhesive 305 is spread on a second silicon wafer and this assembly is bonded at 200° C. with the stack comprising the first silicon wafer and the glass wafer, so as to create an interface 12 between the BrewerBOND® adhesive film 305 and the fluorinated Novec™ 2702 film. The bonding is implemented at 200° C. The adhesion energy of this new interface 12 is evaluated at 0.4 J/m².

Next the second silicon wafer is thinned to 30 μm by mechanical abrasion by means of a diamondised wheel.

By means of a diamondised saw, a trimming of the second silicon wafer is implemented over a width of 2 mm and a depth of 50 µm.

The thinned stack is fixed to a rigid frame by means of a flexible adhesive film, for example known by the trade name ADWILL D650, which has an adhesive layer 10 µm thick, associated with a support film 42 with a thickness of 80 µm. The first silicon wafer is disassembled by inserting a wedge in the stack.

A UV insolation of the adhesive film makes it possible to release the thinned second silicon wafer.

Another aspect relates to the intermediate product comprising:
the stack 123 of the three substrates S1, S2, S3, the second substrate S2 having an exposed surface 21, and
the flexible adhesive film 4 transferred onto the front face FAV of the stack 123.

Figure 4:
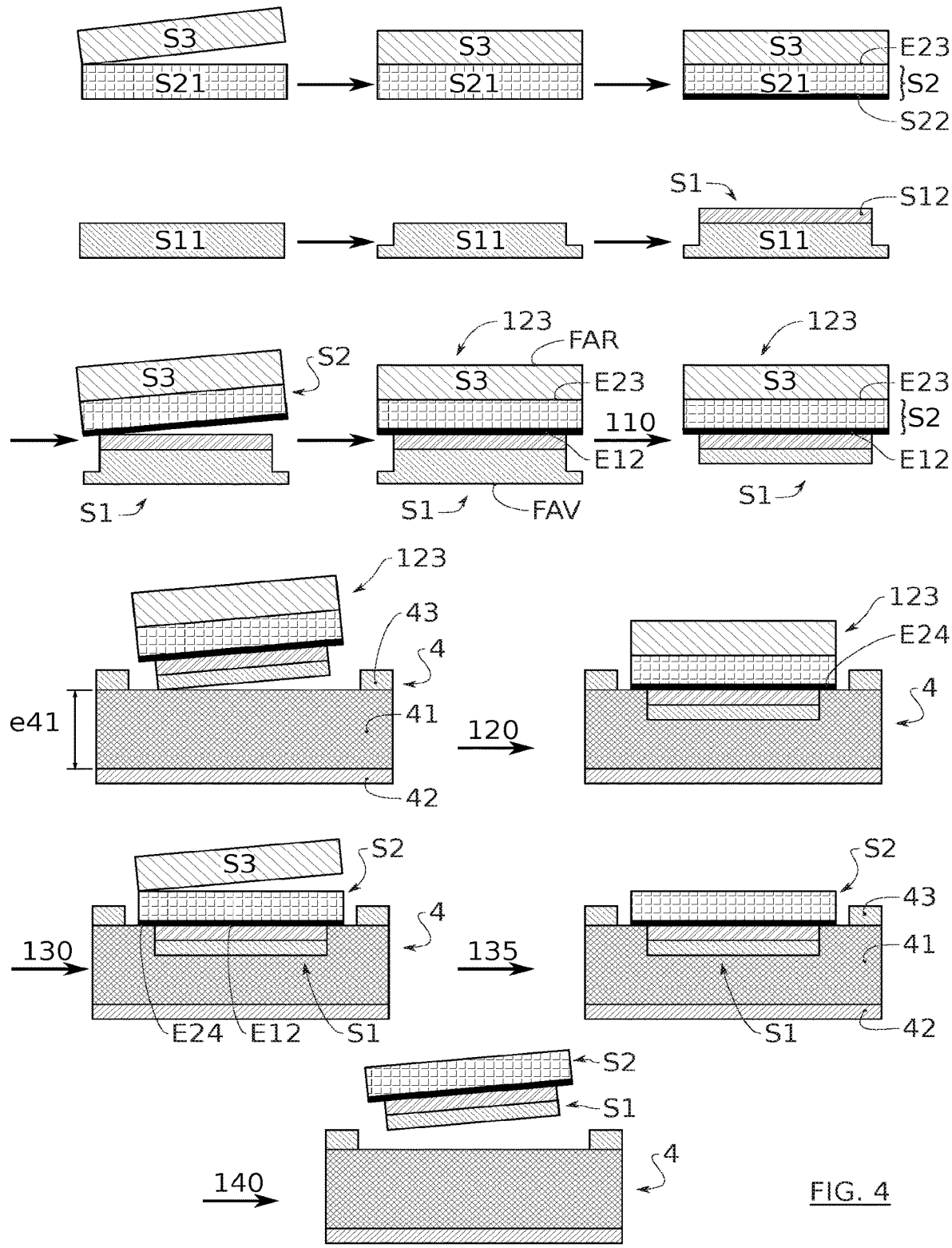
FIG. 4 shows schematically the steps of an example of the first embodiment of the method according to the first aspect of the invention.

Such a microelectronic device is for example shown in FIG. 3A at bottom left, in FIG. 4 on the fourth line on the right, and in FIG. 5 on the second line on the left.

The invention is not limited to the embodiments described above and extends to all embodiments covered by the claims.

For example, material can be removed 110 by microelectronics methods other than by a mechanical method, and in particular grinding. It may more particularly be the case of dry or wet etching, for example by means of a photolithography step.

For example, reduction of the adhesion energy of the flexible adhesive film 4 may be obtained by heat treatment.

The use of a wedge for disassembling 130 the stack 123 is not essential. Alternatives exist that form part of known disassembly techniques. A heat treatment may for example suffice. It is also possible to use a ring configured to engage the third substrate S3 or a sucker.

Choices of flexible adhesive films 4 other than the examples given above can be envisaged. Such a choice may depend among other things on the technique for cleaning the first and second substrates S1 and S2 envisaged following release thereof from the flexible adhesive film 4.

The removal of material 110 applied to the first substrate S1, or even to a part of the second substrate S2, may consist not of complete trimming but may comprise partial trimming, for example in a quarter of a circle, in a semicircle, or in a crescent moon. The removal of material 110 may also comprise, or even consist of, an etching of a part of the first substrate not comprising one of the edges thereof.

The invention claimed is:

1. A method for disassembling a stack of at least first, second and third substrates having two interfaces therebetween, among which a first interface between the first substrate and the second substrate of the stack has a first adhesion energy and a second interface between the second substrate and the third substrate in the stack has a second adhesion energy, the first adhesion energy being lower, than the second adhesion energy, the stack comprising a front face and a rear face between which the first substrate, the second substrate and then the third substrate are stacked in that order, the method comprising successively:
through the front face of the stack, removing a material on the first substrate, until a surface of the second substrate is exposed,
transferring the stack, by means of the front face thereof, onto an adhesive layer of a flexible adhesive film until the surface is in contact with the adhesive layer and has therewith an adhesion energy that is higher than the second adhesion energy, and
disassembling the third substrate from the flexible adhesive film and from an assembly comprising the first and second substrates, at the second interface.

2. The method according to claim 1, wherein the removing comprises at least partial trimming of the first substrate and optionally thinning of the first substrate.

3. The method according to claim 2, wherein the at least partial trimming of the first substrate is implemented by cropping a peripheral region of the first substrate over an entire thickness e1 thereof, optionally by cropping a peripheral region of the second substrate over a depth p less than a thickness e2 of the second substrate.

4. The method according to claim 3, wherein a thickness e41 of the adhesive layer is less than a thickness e1 of the first substrate.

5. The method according to claim 4, wherein, the flexible adhesive film having an area greater than an area of the stack, and the transferring comprises deforming the flexible adhesive film.

6. The method according to claim 5, wherein the deforming is implemented so that the adhesive layer is in contact with at least pan of the exposed surface of the second substrate, and the at least part of the exposed surface extending over a second width 1, taken from one edge of the second substrate, is greater than 0.25 mm.

7. The method according to claim 3, wherein the depth p over which the peripheral region of the second substrate is removed is:
a. greater than 10 µm, and/or
b. less than half of the thickness e2 of the second substrate.

8. The method according to claim 2, wherein the at least partial trimming of the first substrate is parameterised so that the surface extends over a first width d, taken from one edge of a peripheral region of the first substrate, greater than 0.25 mm.

9. The method according to claim 8, wherein a thickness e41 of the adhesive layer is less than a thickness e1 of the first substrate.

10. The method according to claim 9, wherein the stack has a first width d, over which the surface extends, of greater than 1.5 mm.

11. The method according to claim 9, wherein, the flexible adhesive film having an area greater than an area of the stack, and the transferring comprises deforming the flexible adhesive film.

12. The method according to claim 11, wherein the deforming is implemented so that the adhesive layer is in contact with at least part of the exposed surface of the second substrate, and the at least part of the exposed surface extending over a second width 1, taken from one edge of the second substrate, is greater than 0.25 mm.

13. The method according to claim 2, wherein the first width d over which the surface extends is at least 10 times less than an area of the second substrate.

14. The method according to claim 2, wherein the first width d over which the surface extends is less than 10 mm.

15. The method according to claim 1, wherein a thickness e41 of the adhesive layer is greater than a thickness e1 of the first substrate.

16. The method according to claim 15, wherein the transferring is implemented so that the surface is fully in contact with the adhesive layer.

17. The method according to claim 1, wherein the first adhesion energy is less than the second adhesion energy by a value of between 0.1 and 1 mJ/m$^2$ and wherein the adhesive layer of the flexible adhesive film initially has an adhesion energy greater than the second adhesion energy.

18. The method according to claim 1, wherein an adhesion energy between the surface and the adhesive layer is greater than the second adhesion energy by at least 500 mJ/m$^2$.

19. The method according to claim 1, wherein, two substrates selected from the first, second and third substrates, each comprise a film for sealing to other of the first, second and third substrates, and an adhesion energy between the two substrates is defined by an adhesion energy between the films.

20. The method according to claim 1, wherein the disassembling is implemented by inserting a wedge in the stack at the second interface.

21. The method according to claim 1, further comprising, before the transferring, trimming the first substrate, thinning the first substrate and/or marking the first substrate.

22. The method according to claim 1, further comprising:
following the disassembling, releasing the assembly comprising the first and second substrates from the flexible adhesive film, optionally by applying to the adhesive layer a heat treatment or an insolation by UV so as to reduce an adhesion energy thereof.

23. The method according to claim 1, wherein the second substrate comprises a glass handle and the third substrate comprises an opaque material.

24. A microelectronic device, comprising:
a stack of at least first, second and third substrates having two interfaces therebetween, among which a first interface between the first substrate and the second substrate of the stack has a first adhesion energy and a second interface between the second substrate and the third substrate in the stack has a second adhesion energy, the first adhesion energy being lower than the second adhesion energy, the stack comprising a front face and a rear face between which the first substrate, the second substrate and then the third substrate are stacked in that order, the second substrate having an exposed surface, and a flexible adhesive film comprising an adhesive layer onto which the stack is transferred by means of the front face thereof, the exposed surface being in contact with the adhesive layer and having therewith an adhesion energy higher than the second adhesion energy.

* * * * *